(12) United States Patent
Greer et al.

(10) Patent No.: US 12,546,013 B2
(45) Date of Patent: Feb. 10, 2026

(54) ATOMIC LAYER ROUGHNESS REDUCING METHODS AND DEVICES

(71) Applicant: NanoClear Technologies, Inc., Pasadena, CA (US)

(72) Inventors: Harold Frank Greer, Los Angeles, CA (US); Rehan Kapadia, Los Angeles, CA (US)

(73) Assignee: NanoClear Technologies, Inc., Pasadena, CA (US)

(*) Notice: Subject to any disclaimer, the term of this patent is extended or adjusted under 35 U.S.C. 154(b) by 442 days.

(21) Appl. No.: 17/988,734

(22) Filed: Nov. 16, 2022

(65) Prior Publication Data

US 2023/0151495 A1    May 18, 2023

Related U.S. Application Data

(60) Provisional application No. 63/279,902, filed on Nov. 16, 2021, provisional application No. 63/280,032, filed on Nov. 16, 2021.

(51) Int. Cl.
    *C23F 1/12*    (2006.01)
(52) U.S. Cl.
    CPC ..................................... *C23F 1/12* (2013.01)
(58) Field of Classification Search
    None
    See application file for complete search history.

(56) References Cited

U.S. PATENT DOCUMENTS

| | | | |
|---|---|---|---|
| 2006/0099430 A1 | 5/2006 | Subramanya et al. | |
| 2008/0102201 A1 | 5/2008 | Choi et al. | |
| 2011/0014473 A1 | 1/2011 | Mng et al. | |
| 2014/0079884 A1 | 3/2014 | Krogman et al. | |
| 2019/0074389 A1 | 3/2019 | Greer et al. | |
| 2020/0025981 A1 | 1/2020 | Greer et al. | |
| 2020/0161148 A1* | 5/2020 | Abel | C23F 1/08 |
| 2020/0203173 A1* | 6/2020 | Zhang | H01L 21/02252 |
| 2021/0313185 A1* | 10/2021 | Greer | H01L 21/3065 |

FOREIGN PATENT DOCUMENTS

| | | |
|---|---|---|
| JP | 2010-001555 A | 1/2010 |
| WO | 2021150720 A1 | 7/2021 |

OTHER PUBLICATIONS

Wikipedia, "Fluorocarbon" via https://en.wikipedia.org/wiki/Fluorocarbon (Year: 2025).*

* cited by examiner

*Primary Examiner* — Binh X Tran
(74) *Attorney, Agent, or Firm* — David D. Hsu; Polsinelli LLP

(57) ABSTRACT

Methods described herein allow for a smoothing of a particular material on a substrate independently of smoothing a different material on the substrate. Both materials may be exposed to the same reactant but form different skins (e.g., reactive layers). One skin may allow for smoothing of one material, while the other skin may protect or preserve the underlying material. Removing one of the skins may result in a smoother underlying material. The skins may be formed by a dry process and removed by a wet process, or the skins may be formed by a wet process and removed by a dry process. The change of the reaction medium between wet and dry for reaction and removal may allow for highly selective chemistries to result in smoothing one material while not affecting the underlying substrate or other materials at the surface. Substrates produced by these methods are described herein.

21 Claims, 11 Drawing Sheets

ATOMIC LAYER ROUGHNESS REDUCING METHODS AND DEVICES

CROSS-REFERENCE TO RELATED APPLICATIONS

This application claims the benefit of U.S. Provisional No. 63/280,032 filed on Nov. 16, 2021, entitled "ATOMIC LAYER ROUGHNESS REDUCING METHODS AND DEVICES," and U.S. Provisional No. 63/279,902 filed on Nov. 16, 2021, entitled "SUBSTRATE TRANSFER SYSTEMS AND METHODS," the entire contents of both of which are incorporated herein by reference.

BACKGROUND

Devices and elements in semiconductor, display, and optical systems are continuously shrinking in size and increasing in complexity. The assembly of these devices into their final form is also particularly complicated. For either or both of these reasons, the smoothness of the interfaces and surfaces of these components are particularly important. Thus, there is a need to control and minimize the roughness of materials within devices and elements in semiconductor, display, and optical devices for optical, mechanical, and assembly reasons. The present disclosure satisfies these and other needs.

Additionally, improved processing techniques may allow for smaller dimensions and/or improved quality of semiconductor devices. However, the processing techniques, even if more complicated, still are desired to be efficient and stable. Thus, there is a need for method and systems that allow for efficient and controllable processing of substrates. These and other needs are also addressed by the present disclosure.

BRIEF SUMMARY

Methods described herein allow for a smoothing of a particular material on a substrate independently of smoothing a different material on the substrate. Both materials may be exposed to the same reactant but form different skins (e.g., reactive layers). One skin may allow for smoothing of one material, while the other skin may protect or preserve the underlying material. Removing one of the skins may result in a smoother underlying material. The other material that is not smoothed by the first removal of the skin may be further processed for smoothing, etching, or another technique. The skins may be formed by a dry process and removed by a wet process, or the skins may be formed by a wet process and removed by a dry process. The change of the reaction medium between wet and dry for reaction and removal may allow for highly selective chemistries to result in smoothing one material while not affecting the underlying substrate or other materials at the surface. The thickness of the first material may not be changed though the smoothing process. Hence, the smoothing may not be the result of removal of the first material. Substrates produced by these methods are described herein.

Some embodiments include a method for reducing roughness of a substrate. The method may include reacting the first material with a reactant to form a first reactive layer on the substrate. The method may include reacting the second material with the reactant to form a second reactive layer on the substrate. The method may include removing the first reactive layer to form a processed first material, the processed first material having a second roughness less than the first roughness. Removing comprises selectively removing the first reactive layer over the second reactive layer.

Some embodiments may include a substrate processed by the methods for reducing roughness. The substrate may include a processed surface with an RMS roughness less than 0.5 nm. The processed surface may include a metal, such as copper.

Some embodiments include systems including means for carrying out the methods described herein.

Methods and systems described herein allow for more efficient, cost-effective, and precise processing of substrates between process chambers at different pressures. Advantageous processing techniques may involve repeated cycles through a process chamber at one pressure and then a different process chamber at another pressure. Embodiments described herein reduce the amount of transfer time between the process chambers while allowing processing of some substrates even when the pressure around other substrates adjusted for another process chamber. Methods and systems may include a hub that may be pressurized or vented to prepare substrates for transfer into the process chambers. Transfer systems within the hub may allow for substrates to be simultaneously transferred into multiple process chambers. Additionally, transfer systems of the hub may allow for a substrate to be placed into a process chamber and for another substrate in the process chamber to be picked up extra travel by the transfer system between the hub and the process chamber. Methods and systems may allow for processing large area substrates (e.g., 80 inch flat panel displays) in parallel and possibly vertically stacked, thereby reducing the equipment footprint. Furthermore, methods and systems described herein allow for parallel processing of substrates and for changing pressure of substrates during parallel processing of other substrates.

Some embodiments described herein provide a method of processing a substrate. The method may include transferring a plurality of first substrates from a first chamber into a hub at a first pressure. The method may include transferring a plurality of second substrates from the hub at the first pressure into the first chamber. The method may include reducing the pressure of the hub with the plurality of first substrates from the first pressure to a second pressure. The method may include transferring the plurality of first substrates to one or more second chambers at the second pressure. The method may include transferring a plurality of third substrates from the one or more second chambers at the second pressure to the hub at the second pressure. The method may include increasing the pressure of the hub with the plurality of third substrates to a third pressure.

Some embodiments described herein provide a method of processing a substrate. The method may include transferring a plurality of first substrates from one or more first chambers into a hub at a first pressure. The method may include transferring a plurality of second substrates from the hub at the first pressure into the one or more first chambers. The method may include increasing the pressure of the hub with the plurality of first substrates from the first pressure to a second pressure. The method may include transferring the plurality of first substrates to a second chamber at the second pressure. The method may include transferring a plurality of third substrates from the second chamber at the second pressure to the hub at the second pressure. The method may include reducing the pressure of the hub with the plurality of third substrates to a third pressure.

Some aspects described herein provide a substrate processing system. The system may include a wet processing chamber. The system may also include one or more plasma chambers.

The system may further include one or more pumps. In addition, the system may include a gas supply. The system may also include a hub comprising a substrate holder. The substrate holder may include a plurality of shelves configured to transport a plurality of substrates. The substrate holder may be configured to extend and lower each shelf of a first subset of the plurality of shelves into a different plasma chamber of the one or more plasma chambers. The substrate holder may be configured to extend and raise each shelf of a second subset of the plurality of shelves into a different plasma chamber of the one or more plasma chambers. The substrate holder may be configured to extend the plurality of shelves into the wet processing chamber. The one or more pumps may be connected to the one or more plasma chambers and the hub. Additionally, the gas supply may be in fluid communication with the hub.

A better understanding of the nature and advantages of embodiments of the present invention may be gained with reference to the following detailed description and the accompanying drawings.

DETAILED DESCRIPTION

Conventional methods of smoothing surfaces include chemical mechanical planarization/polish (CMP). CMP involves using an abrasive chemical slurry rotated by a head over a substrate. CMP involves direct contact with the substrate being smoothed. Such contact can introduce defects and may damage structures on the wafer. Additionally, CMP may not be easily applied to large substrates, including substrates desired for large display panels. CMP, with a circular planarization motion, also may not be suited for rectangular substrates. Furthermore, CMP may be difficult to control as the process is not self-limiting and depends on both chemical and mechanical factors. In addition, CMP may not be used to smooth one material while not smoothing a neighboring material when both materials are substantially planar.

ATOMIC LAYER POLISH™ or ALP™ reactive layer smoothing techniques may use an entirely fluid phase process utilizing alternating exposures of reactive fluids to obtain a smoother film. This process may be a self-limiting one by forming a skin on top of the material of interest which is removed in a subsequent step. Without intending to be bound by theory, it is thought that the skin and the underlying film may mix together so that the underlying film rearranges and becomes smoother under the skin. Additionally or alternatively, reactive layers may be conformal and self-limiting, and as a result, protrusions or other surface roughness may be attacked in all directions at the same rate, leading to the shrinking of the protrusions and reduction in the overall roughness of the material.

Methods described herein may smooth one material of a surface but may not affect another material of the same surface. The smoothing of one material but not the other may involve reacting both materials with the same reactant. Even though both reactive layers over the different material may include similar components resulting from the reactant, the removal of the reactive layers may result in smoothing of one material and not affecting the other material. The reactive layers may be removed individually with different wet or dry processes. Different reactants, reaction media, removal chemistries, and removal media may allow for different processing of different materials occupying the same surface of a substrate. However, repeatedly alternating processes at different pressures (e.g., wet and dry processing) may result in unmanufacturable processing times and equipment layout. Methods and systems described herein overcome the obstacles of conventional processes and equipment to allow for a manufacturable process.

I. Smoothing Process Overview

Figure 1:
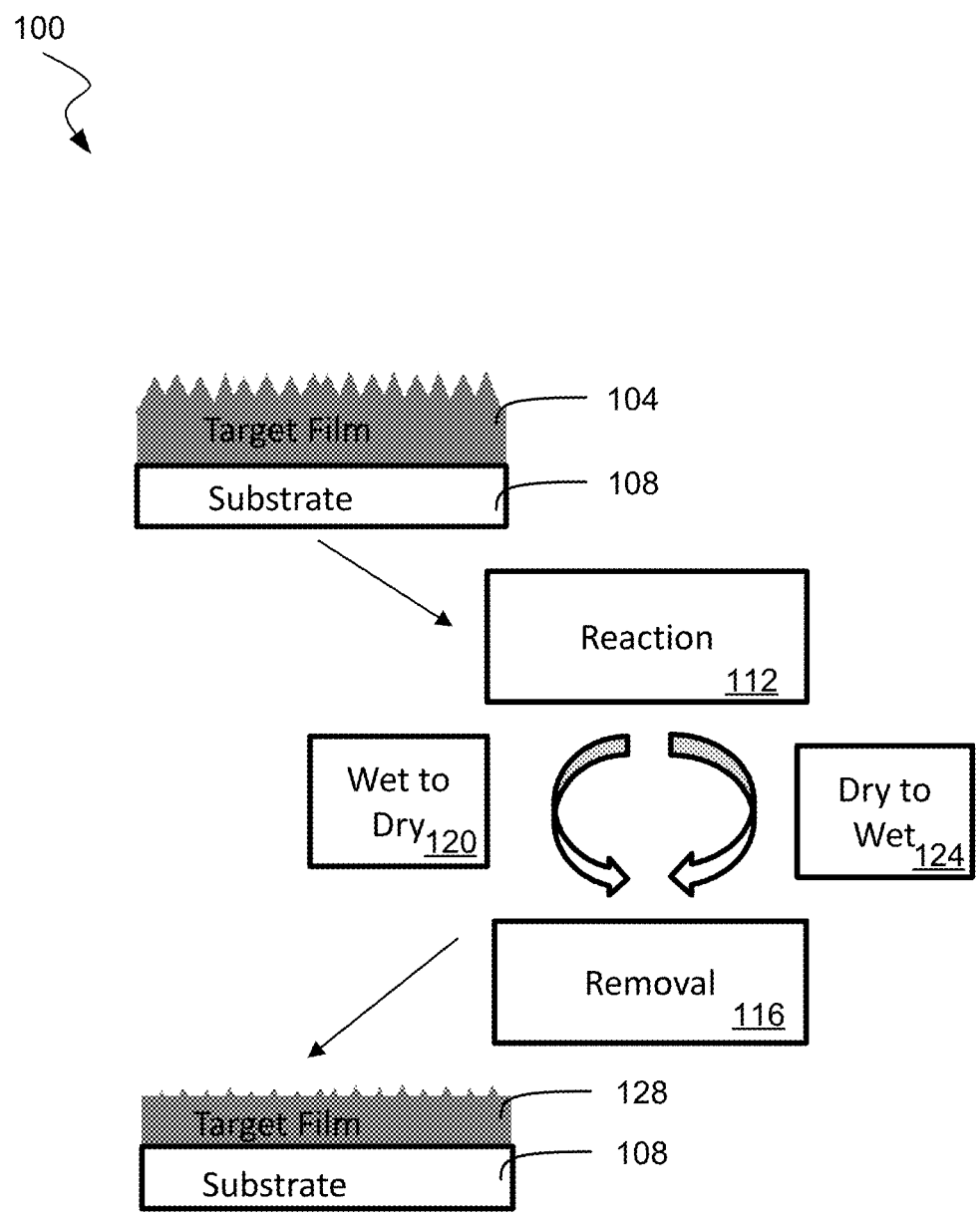
FIG. 1 shows an illustration of the ALP™ reactive layer smoothing process according to embodiments of the present invention.

FIG. 1 shows an illustration of the ALP™ reactive layer smoothing process. A target film 104 is on top of a substrate 108. Target film 104 may have a certain roughness. Some ALP™ reactive layer smoothing processes are described in U.S. Patent Publication No. 2021/0313185 A1, the entire contents of which are incorporated herein by reference for all purposes.

Target film 104 may undergo a reaction (stage 112) to form a reactive layer. The reaction may be self-limiting so that the reaction stops when the exposed surface of the target film 104 is fully covered by the reactive layer. The reacting may include an oxidation step, which is often self-limiting due to Deal-Grove type reaction and diffusion of oxidative species. In some embodiments, the reactive layer may be activated by ions from a plasma. The ions from the plasma may allow the reactive layer to mix with the underlying target film.

The reactive layer on top of target film 104 may be removed (stage 116). Removal of the reactive layer may result in a target film 128 that is less rough than the target film before the reactive layer.

The reactive layer may be formed with a wet process and then removed with a dry process (e.g., plasma etch) (stage 120). Alternatively, the reactive layer may be formed with a dry process (e.g., atomic layer deposition [ALD], chemical vapor deposition [CVD], plasma-enhanced chemical vapor deposition [PECVD]), and the reactive layer may be removed with a wet process (e.g., wet etch) or a dry process.

The change in the reaction medium from dry to wet or wet to dry may allow for more reaction and removal reactions to be used. Additionally, the available chemistries may allow leveraging of the reactivity differences by plasmas/gaseous compounds with thin films and solubility differences for the reactive layers in solution. For example, a dry chemistry may be selected that results in a high reactivity between the target film and a plasma or gaseous compound, where that layer formed by the reaction has a high solubility in a wet etch solution. The chemistry may also result in a layer formed over another film that does not have a high solubility in a wet etch solution.

The reactive layer for a metal may be an oxide, chloride, fluoride, bromide, etc. that may be readily removed in acids or bases, but the pure metal may be untouched by the acid or base chemistry.

A. Example Methods

Figure 2:
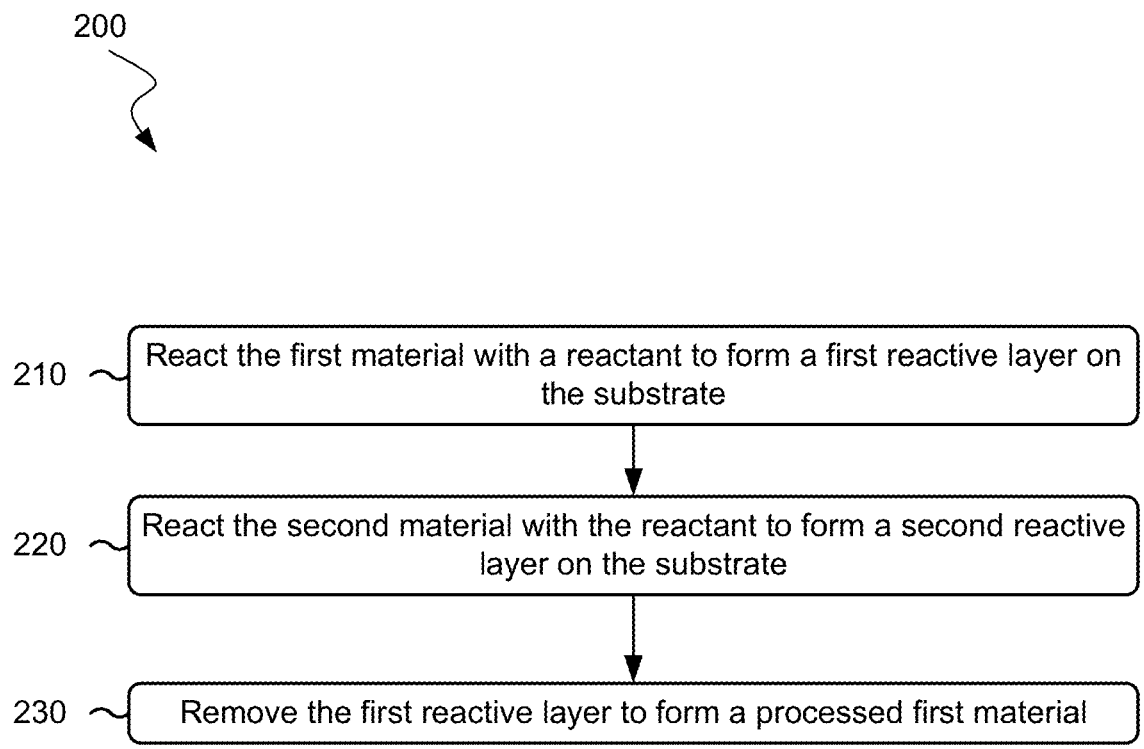
FIG. 2 is a flowchart of an example process associated with reducing atomic layer roughness according to embodiments of the present invention.

FIG. 2 is a flowchart of an example process 200 associated with reducing atomic layer roughness. In some implementations, one or more process blocks of FIG. 2 may be performed by a system (e.g., system 420). In some implementations, one or more process blocks of FIG. 2 may be performed by another device or a group of devices separate from or including the system.

The substrate may have a surface. The surface may be substantially planar. For example, the surface may be a blanket or unpatterned surface that is planar with the exception of the surface roughness. Substantially planar may be planar within 1 nm or 1 to 2 nm. In some embodiments, the surface and/or substrate may be curved. The surface may include a first material and a second material. The first material is different from the second material. The first material may have a first roughness at the surface. In some embodiments, the surface includes regions of the first material and other material that may be substantially planar. Other regions of the surface may not be coplanar with those regions that are substantially planar. In some embodiments, the surface may be patterned and the top part of the surface (e.g., not etched to form trench or via or other concavity) may be substantially planar. In some embodiments, the surface may not be substantially planar and may be patterned to form structures of different heights. The materials of the substrate may be materials overlaying a semiconductor wafer.

The first material may be a metal. The metal may include copper, cadmium, gold, silver, palladium, rhodium, bronze, brass, lead, nickel silver, beryllium copper, carbon steel, low alloy steel, zinc, tin, nickel, cobalt, tungsten, or chrome. The first material may include a dielectric or semiconductor, including any described herein. In some embodiments, the first material may be glass including sapphire.

The second material may be a second metal, a dielectric (e.g., an oxide, a metal nitride, or a metal fluoride), or a semiconductor. Oxides may include silicon oxide (e.g., silicon dioxide), yttrium-barium-copper oxide, or a metal oxide of any metal described herein. Metal oxides may also include titanium oxide or aluminum oxide. The metal nitride may be a nitride of any metal described herein (e.g., titanium). A metal fluoride may include CaF2, MgF2, or LiF. The semiconductor may include silicon (e.g., crystalline or amorphous), germanium, III-V semiconductors (e.g., GaAs, GaP, InAs, InP), or II-VI semiconductors. In some embodiments, the second material may be in a different category than the first material. For example, if the first material is a metal, the second material may be a dielectric or semiconductor. As another example, if the first material is a dielectric, the second material may be a metal or a semiconductor.

At block 210, process 200 may include reacting the first material with a reactant to form a first reactive layer on the substrate. The reactant may be a gas or a plasma. Reacting the first material with the reactant may occur with no bias applied to the substrate. In some embodiments, the reactant may be liquid. Reacting the first material with the reactant may be a self-limiting reaction. In some embodiments, reacting the first material with the reactant may or may not involve a chemical reaction. The reactant or components of the reactant may be adsorbed onto the first material. In some embodiments, the reactant may be electroplated onto the first material.

In some embodiments, the reactant may include a fluorocarbon. The fluorocarbon may include $CF_4$, $C_2F_6$, $C_3F_6$, $C_4F_8$, $C_xF_y$, (where x is 1 to 10, and y is 4 to 22), or any compound thereof where one or more fluorine atoms are substituted with a hydrogen atom or a non-fluorine halogen atom. The fluorocarbon may be linear or cyclic, and saturated or unsaturated. The fluorocarbon may include one or more double bonds and/or one or more triple bonds.

In some embodiments, the reactant may include a carbon-containing compound, including carbon dioxide or methane. The reactant may supply carbon for the first reactive layer.

In some embodiments, the reactant comprises an oxidizer, molecular nitrogen, and/or a noble gas. The molar ratio of the oxidizer to the sum of the nitrogen and noble gas may be from 20:1 to 10:1, from 10:1 to 5:1, from 5:1 to 2:1, from 2:1 to 1:1, from 1:1 to 1:2, from 1:2 to 1:5, from 1:5 to 1:10, or from 1:10 to 1:20. The oxidizer may include molecular oxygen, molecular halogen, ozone, or atomic oxygen. An oxidizer may result in the reactive layer being an oxide. The reactant containing molecular nitrogen or a nitrogen-containing compound may result in the reactive layer being a nitride. Reactants may include $N_2O$, $N_2H_2$, or $NF_3$.

Halogens may include fluorine, chlorine, bromine, iodine, or astatine, and may resulted in a halogenated reactive layer. Noble gases may include helium, neon, argon, krypton, xenon, or radon. In some embodiments, the reactant may include a sulfide, a hydrogen (e.g., $H_2$), or a hydride. The reactant may include any combination of species described herein.

The first reactive layer formed may be a salt. When the first material is copper, the reactive layer may include CuCl, CuOCl, $CuOCl_2$, $CuCl_2$, or CuF.

In some embodiments, reacting the first material with the first reactant may be at low temperatures. For example, the reaction temperature may be around −50° C., from −60 to −50° C., −50 to −40° C., −40 to −30° C., or −30 to −0° C. In some embodiments, reacting the first material with the first reactant may be at room temperature (25° C. to 27° C.) or higher.

At block 220, process 200 may include reacting the second material with the reactant to form a second reactive layer on the substrate. The second reactive layer may be different from the first reactive layer, but the second reactive layer may include many of the same atoms as the first reactive layer because the same reactant is used. In some embodiments, block 220 may occur before block 210. In this manner, the second material is protected by the second reactive layer first and then the smoothing of the first material may proceed while the second material is protected.

The first reactive layer and/or the second reactive layer may include carbon and fluorine, including when, for example, the reactant includes a fluorocarbon. In some embodiments, the first reactive layer and/or the second reactive layer may include an oxide, a nitride, a sulfide, an oxynitride, or a halogenated reactive layer.

In some embodiments, process 200 may include contacting the first reactive layer with a plasma. The plasma may be formed using any of the gases described herein, including nitrogen, oxygen, and/or a noble gas. Contacting the first reactive layer with the plasma may activate the reactive layer. The ions from the plasma may bombard the first reactive layer to impart energy to the layer and cause the reactive layer to be better mixed and more homogenous in the reactive layer. The substrate may be biased to enhance ion bombardment. The ions from the plasma may or may not activate the second reactive layer in a similar way. Ions may include noble gas ions, argon ions, or nitrogen ions.

In some embodiments, process 200 may include contacting the first reactive layer with an organic solvent, acid, base, or heated fluid, including any liquid or fluid described herein. This contact with a liquid or fluid may occur after the first reactive layer is formed through a wet process. This contact may activate the first reactive layer.

At block 230, process 200 may include removing the first reactive layer to form a processed first material. The processed first material may have a second roughness less than the first roughness. The second roughness may be an (root mean squared) RMS roughness less than 1 nm. Removing may include selectively removing the first reactive layer over the second reactive layer. Removing the first reactive layer may selectively etch the first reactive layer but not the first material. The etch selectivity of the first reactive layer may be at least 2 times, 5 times, 10 times, 20 times, 50 times, or 100 times etching the first material. The etch selectivity may be a range between any two of the minimum etch selectivities disclosed.

Removing the first reactive layer may include using a self-limiting or atomic layer etch. In one example, etching represents one or more exposures of the reactive layer to a fluid or a liquid. That liquid or series of liquids can etch away or dissolve the reactive layer, leaving the underlying substrate material. In one example, etching comprises dry etching the wet etched surface, e.g., using ions in a plasma. In some embodiments, removing the first reactive layer may include reducing the first reactive layer. Process 200 may include removing the second reactive layer by dry etching the second reactive layer. Dry etching the second reactive layer may include using a reducing gas or plasma, including ammonia, hydrazine, or hydrogen. Dry etching the second reactive layer may use ion bombardment using argon or another noble gas.

Removing the first reactive layer may include contacting the first reactive layer with a liquid. The liquid may include an acid, a base, an organic solvent, or water (e.g., pH neutral water). In some embodiments, the first reactive layer may be removed by contacting the first reactive layer with a fluid, such as supercritical carbon dioxide or other supercritical fluids. The removal of the first reactive layer may not etch the first material. The amount of first material present on the substrate may be the same (or within 1%, 2%, 5%, 10% by mass) as before removal of the first reactive layer. However, the first material may be redistributed so as to reduce roughness.

Acids may include HF, citric acid, HC1, Lewis acids, organic acids, mineral (inorganic acids), sulfonic acids, carboxylic acids, or halogenated carboxylic acids. Bases may include $NH_3$, NaOH, hydroxides, Lewis bases, organic bases, or inorganic bases.

Unexpectedly, even though both the first reactive layer and the second reactive layer may include carbon and fluorine, the first material may be smoothed through the removal of the first reactive layer, but the second reactive layer may not be smoothed through the removal of the second reactive layer. In some embodiments, the removal of the first reactive layer may not result in the removal of the second reactive layer. The etch selectivity of the first reactive layer may be at least 5 times, 10 times, 20 times, 50 times, or 100 times etching the second reactive layer.

Process 200 may include removing the second reactive layer by contacting the second reactive layer with a liquid or dry etching the second reactive layer. The removal of the second reactive layer may be through a different chemistry than the removal of the first reactive layer and may include any removal technique and chemistry described herein.

In some embodiments, the second material may be smoothed by the removal of the second reactive layer. The second material may have a third roughness at the surface. The second material may have a fourth roughness at the surface after removing the second reactive layer. The third roughness may be greater than the fourth roughness.

In some embodiments, the process of forming a reactive layer and removing the reactive layer may be repeated to further decrease surface roughness. For example, process 200 may include reacting the reactant with the processed first material to form another reactive layer. This other reactive layer may be removed to form a further processed first material. The further processed material may have a roughness less than the second roughness. The cycling between forming the reactive layer and removing the reactive layer may be repeated 2, 3, 4, 5, 5 to 10, or more than 10 times.

In some embodiments, the second material may be smoothed after the first material has been smoothed. The second material may have a third roughness at the surface. The method may also include reacting the second material with a second reactant to form a third reactive layer. The processed first material may be reacted with the second reactant to form a fourth reactive layer. The third reactive layer may be removed to form a processed second material. The processed second material may have a fourth roughness less than the third roughness. In some embodiments, process 200 may include removing the fourth reactive layer from the processed first material. The processed first material may maintain the second roughness after removal of the fourth reactive layer.

In some embodiments, the second material may undergo other processing after the first material has been smoothed. For example, the second reactive layer may be removed. Another reactive layer may be formed on the processed first material. The reactive layer may protect the processed first material. The second material may be etched to form a recess. The etching may be possible because the second material does not have a reactive layer on top or because the reactive layer on top of the second material can be etched selectively to the reactive layer on top of the processed first material.

In some embodiments, the surface may include a third material. The process may further include reacting the third material with the reactant to form another reactive layer on the substrate. Removing the first reactive layer may include selectively removing the first reactive layer over the reactive layer over the third material. In some embodiments, the surface may be treated by redistributing material but not removing the material. For example, the surface may be bombarded with low energy argon ions.

In some embodiments, process 200 may include passivating the processed first material. Passivating the processed first material may include depositing a passivation layer over the processed first material.

Methods described herein may involve combinations of different reaction media and chemistries. For example, reacting the materials may be with a dry reactant, and removal may be with a wet chemistry. Removal with a wet chemistry may not involve entire wafer or substrate to be wet. For example, a small region may be isolated and wet chemistry may be applied with a dispensing head and removal may be with a rinse or a vacuum. In other examples, reacting the materials may be with a wet reactant, and removal may be with dry chemistry. In some examples, reacting and removal may be with the same phase (dry/wet). The reactant chemistry may be a chemistry that affects a first material more than a second material. The removal chemistry may be a chemistry that also affects the first reactive layer more than other materials. As an example, for a substrate with copper and silicon, copper may be desired to be smoothed, but silicon may be desired to be unaffected by the smoothing process. A plasma of nitrogen, oxygen, and argon may oxidize copper. An acid, such as HCl or citric acid, can be used to remove the oxidized copper while not affecting silicon.

As examples, a reactant may form a reactive layer more or less preferentially on the first material than the second material. The removal chemistry may be selective toward the first reactive layer over the second reactive layer. In some embodiments, the removal chemistry may not affect the second material.

Process 200 may exclude smoothing the first material in a chemical mechanical planarization (CMP) process. The process may exclude a mechanical polish or planarization to reduce the roughness of the first material. For example, the first material may not be contacted by slurry with solid particles used to polish the first material. In embodiments, no CMP step may be performed on the first material before the first material is bonded with another surface (e.g., another surface with the same material as the first material).

Although FIG. 2 shows example blocks of process 200, in some implementations, process 200 may include additional blocks, fewer blocks, different blocks, or differently arranged blocks than those depicted in FIG. 2. Additionally, or alternatively, two or more of the blocks of process 200 may be performed in parallel.

B. Example Devices

Figure 3A:
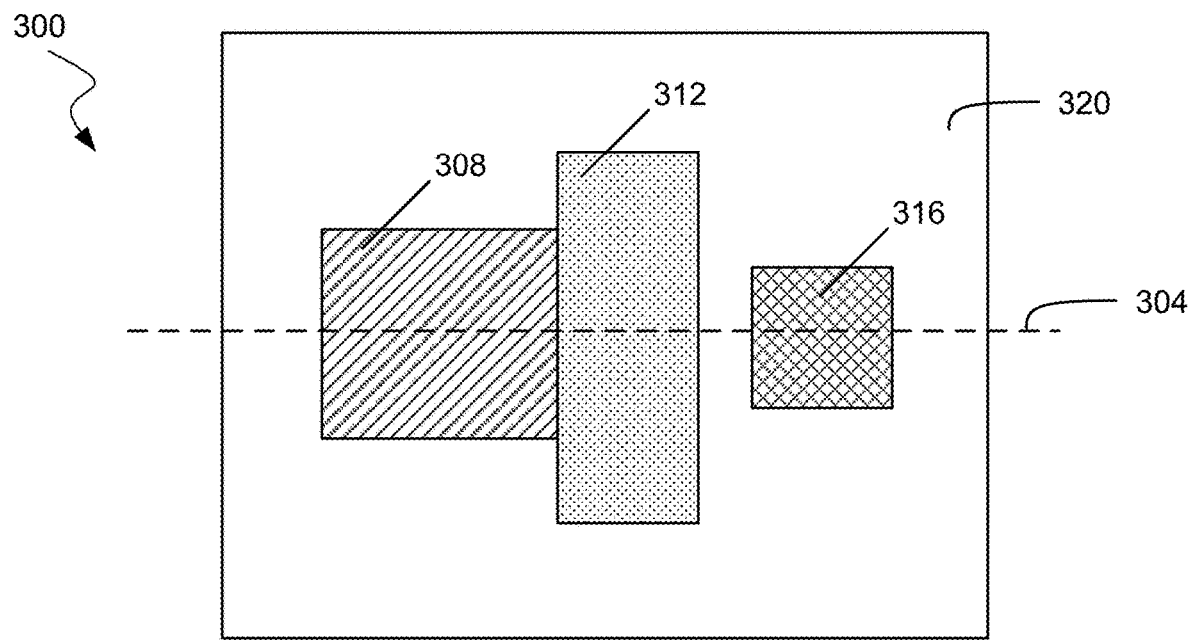
FIGS. 3A and 3B illustrate a device according to embodiments of the present invention.
Figure 3B:
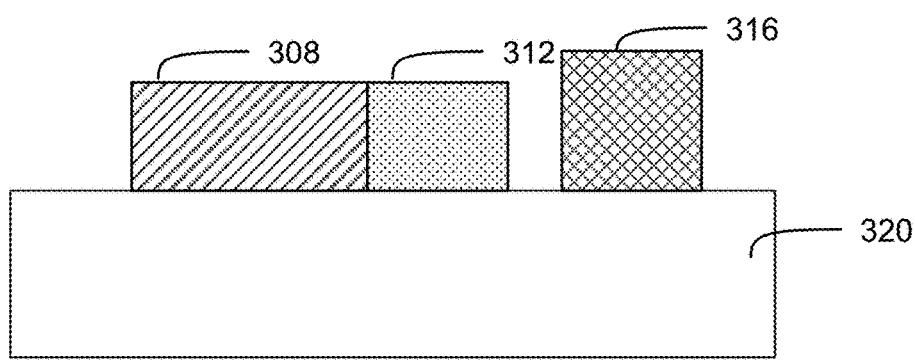

Embodiments may include a substrate treated by any of the methods described herein. FIG. 3A shows a top view of a substrate 300. FIG. 3B shows a cross section along line 304 in FIG. 3A. The substrate 300 may include a processed first material 308, a second material 312, and/or one or more other materials 316. The materials may be over a semiconductor wafer 320. The first material 308, second material 312, and other materials 316 may be any material described herein. The reactive layers may be removed so that the surface of the substrate 300 contacting the atmosphere is the processed first material 308, the second material 312, and/or one or more other materials 316. The processed first material may be characterized by an RMS roughness less than 1 nm, including from 1.0 to 0.5 nm or from 0.5 to 0.2 nm. The roughness may be measured across the surface area.

FIG. 3B shows the other materials 316 with a different thickness than first material 308 and second material 312. This figure illustrates that the materials may have the same or different thicknesses. Smoothing of some surfaces, which may be shorter than others, may be possible even when the taller surfaces are not smoothed. For example, first material 308 may be smoothed even though other materials 316 may not be. This type of processing is not possible with conventional CMP processing.

The processed first material may have a rectangular surface area greater than 500 $cm^2$, including a surface area greater than 1 $m^2$, greater than 2 $m^2$, or greater than 5 $m^2$. The processed first material may be copper, and the copper may have a surface area suitable for large display panels.

The first material may be patterned into a plurality of posts or wires before reacting the first material with the reactant. The posts may each have a surface area of 100 $\mu m^2$ (e.g., 10 $\mu m \times 10$ $\mu m$) or less, 50 to 100 $\mu m^2$, 100 to 200 $\mu m^2$, 200 to 300 $\mu m^2$, or more than 300 $\mu m^2$. The first material may have a thickness of 1 to 10 nm, 5 to 10 nm, 10 to 15 nm, 15 to 20 nm, or more than 20 nm. The posts may be used as contact pads. The wires may be used for THz applications. The second material and/or the other materials may be patterned in similar forms as the second material.

In some embodiments, fluorocarbon compounds may be adsorbed onto the processed first material. The fluorocarbon compounds may be present in a range of surface concentrations from 0.1% to 30%, 0.1% to 1%, 1% to 5%, 5% to 10%, 10% to 15%, 15% to 20%, 20% to 25%, 25% to 30%, all of which may be measured by secondary ion mass spectrometer (SIMS)

In some embodiments, the processed first material is passivated. A passivation layer may be deposited on the processed first material. The passivation layer may be any layer that prevents the processed first material from reacting. The passivation layer may be a fluorocarbon film.

C. Example Systems

Figure 4:
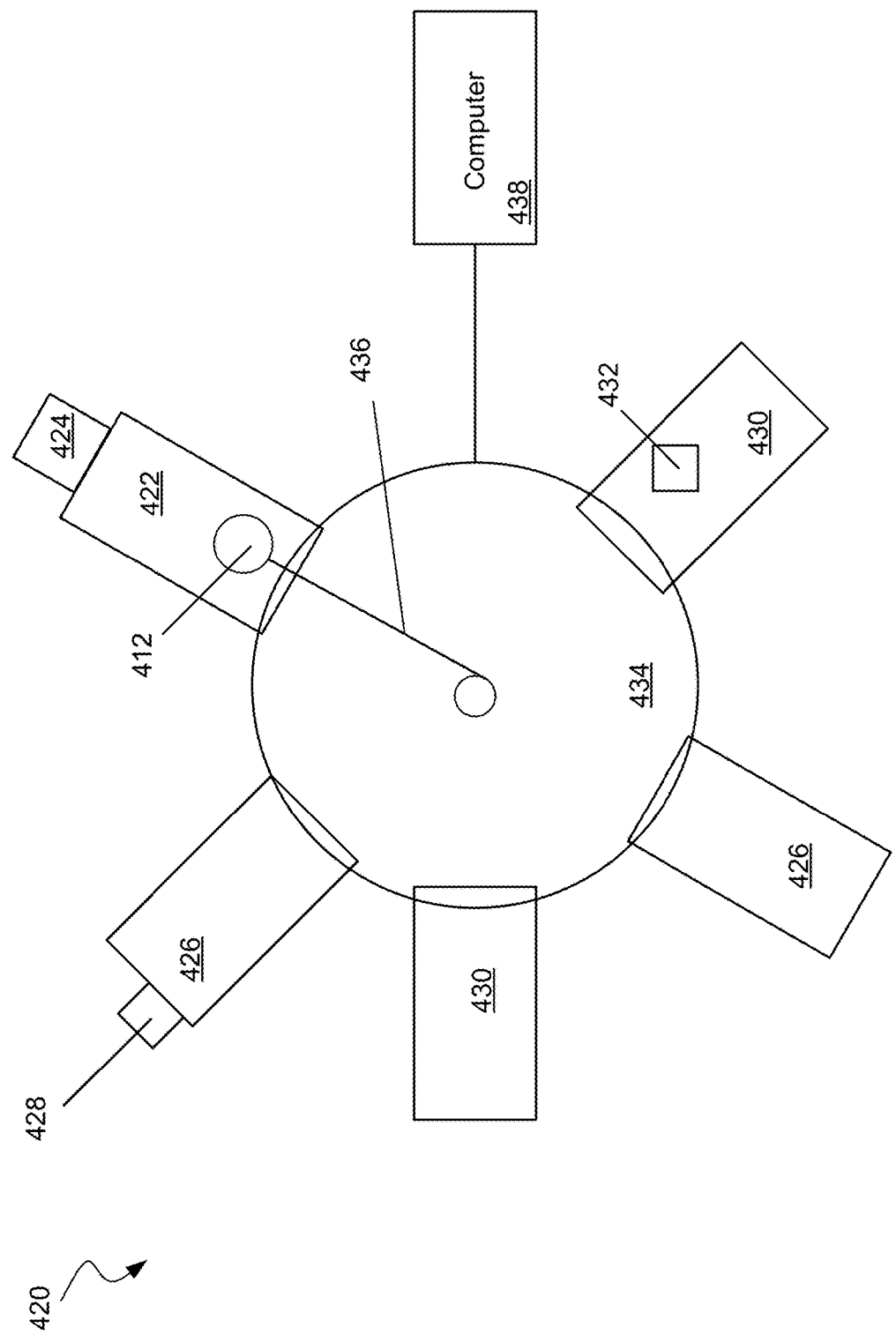
FIG. 4 illustrates an example system according to embodiments of the present invention.

FIG. 4 illustrates an example system 420 with a cluster tool for performing processes described herein (e.g., process 200) to produce a substrate with a smoothed film. The system may include a load lock chamber 422 for loading a substrate 412 comprising a material into the system; a loading port 424 for loading the substrate into the load lock chamber 422; one or more dry process chambers 426 coupled to a source 428 of a reactant; and one or more wet process chambers 430 coupled to a source 432 of (e.g., liquid) wet etchant; a transfer chamber 434; and one or more arms 436.

The reactant in the dry process chamber may include a gas or a plasma 410 reacting with a surface of a substrate 412 in the one of the dry process chambers 426 to form a reactive layer on the substrate. The reactive layer may include a chemical compound including the reactant (or a derivative thereof) and the material. The dry process chamber 426 may include one or more electrodes and one or more voltage sources for applying a bias voltage accelerating the ions in the plasma to the substrate. In one or more examples, the source of the reactant may include an inductively coupled plasma. In one or more examples, the source of the reactant may include a near atmospheric pressure plasma. In addition, the dry process chamber 426 can be an environmentally controlled oven that introduces reactive gases that can react with the surface to make the reactive layer. That reaction process can be dissociative chemisorption (such as Cl2 and Cu forming CuCl and/or CuCl2 due to thermal energy only with no plasma needed). The (e.g., liquid) wet etchant in wet process chamber 430 selectively etches the reactive layer (e.g., over the substrate, at a much higher etch rate than the material in the substrate, or so that the substrate or the material in the substrate is not etched) in one of the wet process chambers 430.

The transfer chamber 434 transfers the substrate between the load lock chamber 422, the dry process chambers 426, and the wet process chambers 430. The one or more arms 436 are positioned to transfer the substrate between the load lock chamber 422, the dry process chambers 426, and the wet process chambers 430.

FIG. 4 further illustrates a computer 438 (a) instructing the conveying system (e.g., arm 436) to move the substrate 412 to one of the reactor tools and instructing the reactor tool to control output of the reactant onto the substrate 412 so as to initiate and control the reacting; and (b) instructing the conveyor system to move the substrate 412 to one of the etching tools and instructing the source of the etchant to controllably contact the etchant on the reactive layer so as to controllably etch the reactive layer after formation of the reactive layer. The etch may be wet (e.g., in wet process chamber 430) or dry (e.g., in dry process chamber 426).

In one example, the substrate can be carried through or past the reactor comprising an oxidative region or reducing region (wherein a reactive layer is formed on the substrate 412 through oxidation or reduction using, for example, oxygen, halogens, or gases) into the reactor comprising vacuum chamber with a specified isolated region. After oxidation or reduction, the substrate can be carried into or through the wet process etching tool comprising a spray coating system that can apply a dilute aqueous acid, base, or solvent to strip the oxide or reactive layer. In another example, the wet process chamber 430 may include a bath (e.g., comprising aqueous acid, base, or solvent) wherein the substrate is dipped to remove the reactive layer.

In another embodiment, the reactor tool comprises an atmospheric plasma or ultraviolet (UV) ozone system configured to raster over or expose the substrate and the etching tool comprises a spray coating system to first apply an acid, base, or solvent and then spray neutral pH solutions to remove the acidic or basic liquid(s).

In various examples, the system includes a plurality of (e.g., two) dry process chambers 426 and a plurality of (e.g., two) wet process chambers 430. One of the process chambers may include a reactor for forming a reactive layer useful for coarse removal (block 210), and another of the process chambers may include a reactor for forming the reactive layer configured for fine etching in the subsequent removal (subsequent reaction and removal after block 230). The formation of the reactive layer may be by either a wet process chamber 430 or a dry process chamber 426. In other examples, the substrate is transferred back and forth between a reactor tool a removal tool to perform the multiple cycles of smoothing.

In one or more examples, system 420 may further include an oven or thermal chamber for drying or heating the substrate during one or more of the steps of process 200.

In one or more examples, the system 420 may include a pre-cleaning module for pre-cleaning a surface of the substrate (e.g., using argon ion bombardment, oxygen cleaning, or hydrogen reduction) prior to forming the reactive layer.

In one or more examples, the system 420 may include an activation module for activating the reactive layer (e.g., using argon ion bombardment) prior to a removal step (e.g., a wet or dry removal step). In or more examples, the reactor may include or may be coupled to the pre-cleaning and/or activation modules.

In some embodiments, substrate 412 may be a substrate under a certain size. For example, substrate 412 may have a diameter or characteristic length less than or equal to 36 inches, 24 inches, 18 inches, or 12 inches.

D. Examples

Figure 5A:
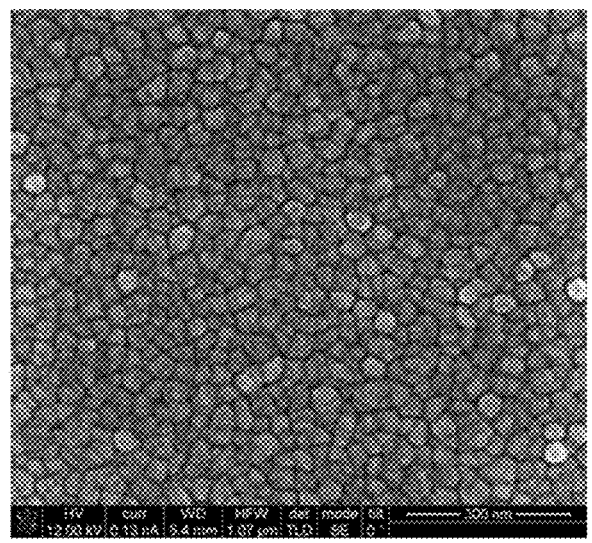
FIGS. 5A and 5B are scanning electron microscope (SEM) images of copper surfaces according to embodiments of the present invention.

FIG. 5A is a scanning electron microscope (SEM) image of a copper surface as deposited. The copper grains were readily noticeable.

Figure 5B:
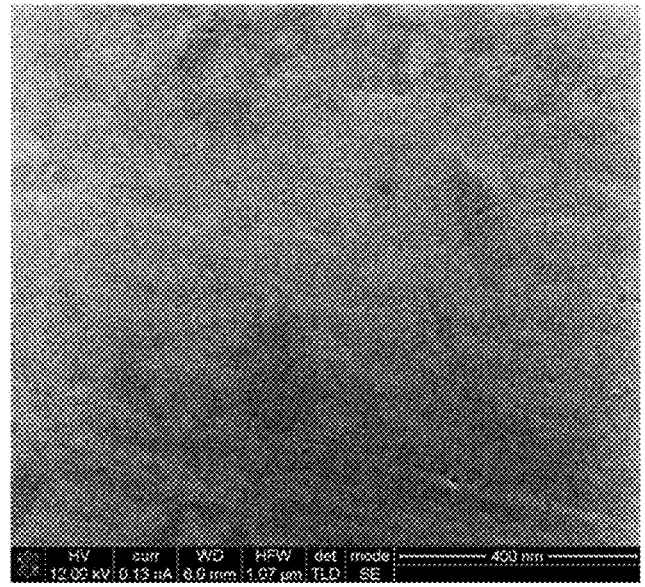

FIG. 5B shows a SEM image of the surface after forming a reactive layer and removing the reactive layer from the copper. The reactive layer was formed by reacting the surface with a mixture from a plasma of oxygen, nitrogen, argon, and $C_4F_8$ at −50° C. The image shows a smoother surface than FIG. 4B without visible grain boundaries. The RMS roughness was measured by atomic force microscope (AFM) at 0.49 nm. Additional analysis indicated that the smoothness of the surface was not a result of the thickness of the copper layer changing. As a result, the smoothness was not the result of the copper being etched away.

II. Substrate Transfer Systems and Methods

Advanced processing techniques may include repeated cycles of processing at one pressure followed by processing at another pressure, including processes described herein. As another example, ATOMIC LAYER POLISH™ and ALP™ reactive layer smoothing techniques may involve a dry process to form a reactive layer and then a wet etch to remove the reactive layer to form a smooth substrate. Similar techniques are described in U.S. Publication No. 2021/0313185 A1, the entire contents of which are incorporated herein for all purposes. The cycle of dry processing followed by wet processing may be repeated several times to achieve a sufficiently smooth substrate. Alternatively, ATOMIC LAYER POLISH™ and ALP™ reactive layer smoothing techniques may include repeated cycles of a wet process followed by a dry process. The wet process is typically at atmospheric pressure, while the dry process is typically at a lower pressure. Conventional methods of wet and dry processing involve using separate wet benches and dry processing tools. However, such tools require transfers of substrates between the tools. These transfers can take minutes, which may be longer than the dry and/or wet processing time in any cycle. Accordingly, transferring substrates between a dry process tool and a wet bench tool may result in long overall process times and may not achieve a substrate throughput sufficient for cost effective manufacturing. Additionally, transfers between processing tools potentially expose substrates to more defects, resulting from contact with a substrate carrier or exposure to an uncontrolled atmosphere.

Embodiments described herein allow for improved processing over conventional methods. Methods and systems described herein may eliminate transfers of substrates between separate tools. The dry processing chambers and wet processing chamber(s) may be integrated into the same tool. Substrates may not enter a substrate carrier, such as a FOUP (front opening universal pod) between dry processing and wet processing. Furthermore, a hub may be used to hold substrates and adjust pressures to match the pressures of dry processing or wet processing. In this manner, the pressure surrounding substrates to be processed may be adjusted while other substrates are processing in parallel. By contrast, conventional methods of processing typically involve reducing pressure for all wafers before processing. Additionally, embodiments described herein allow for parallel dry processing and wet processing. Because reducing or increasing pressure of substrates can be done in parallel with substrate processing and because dry and wet processing can be done in parallel, the processing time may be reduced by a factor of more than 5, 10, or 15, depending on the parameters of the processing recipes.

Embodiments described herein may also facilitate a manufacturable process for large substrates. Large substrates may include those used for large display panels. The substrate may have a rectangular surface area greater than 500 cm$^2$, including a surface area greater than 1 m$^2$, greater than 2 m$^2$, or greater than 5 m$^2$. Systems and methods described herein can process large substrates in parallel (e.g., horizontally stacked) while maintaining a reasonable equipment footprint and substrate throughput.

Embodiments described herein may also improve processing quality and result in a higher quality processed substrate or increase device yield. Methods and systems reduce the time substrates are outside a controlled atmospheric environment. The substrates may be in a controlled environment between dry processing and wet processing. The hub used to hold substrates may use an inert gas (e.g., nitrogen or argon) to increase pressure surrounding the substrates. As a result, the substrates are not in contact with atmospheric air, which includes oxygen and may cause undesired oxidation of portions of the substrate. Additionally, the substrates are spared additional transfers into and out of FOUPs or other substrate carriers, which may avoid certain defect modes. Furthermore, in addition to efficiencies for processing time, systems and methods be more efficient and cost effective as a result of reduced pumping power.

A. Overview

Figure 6:
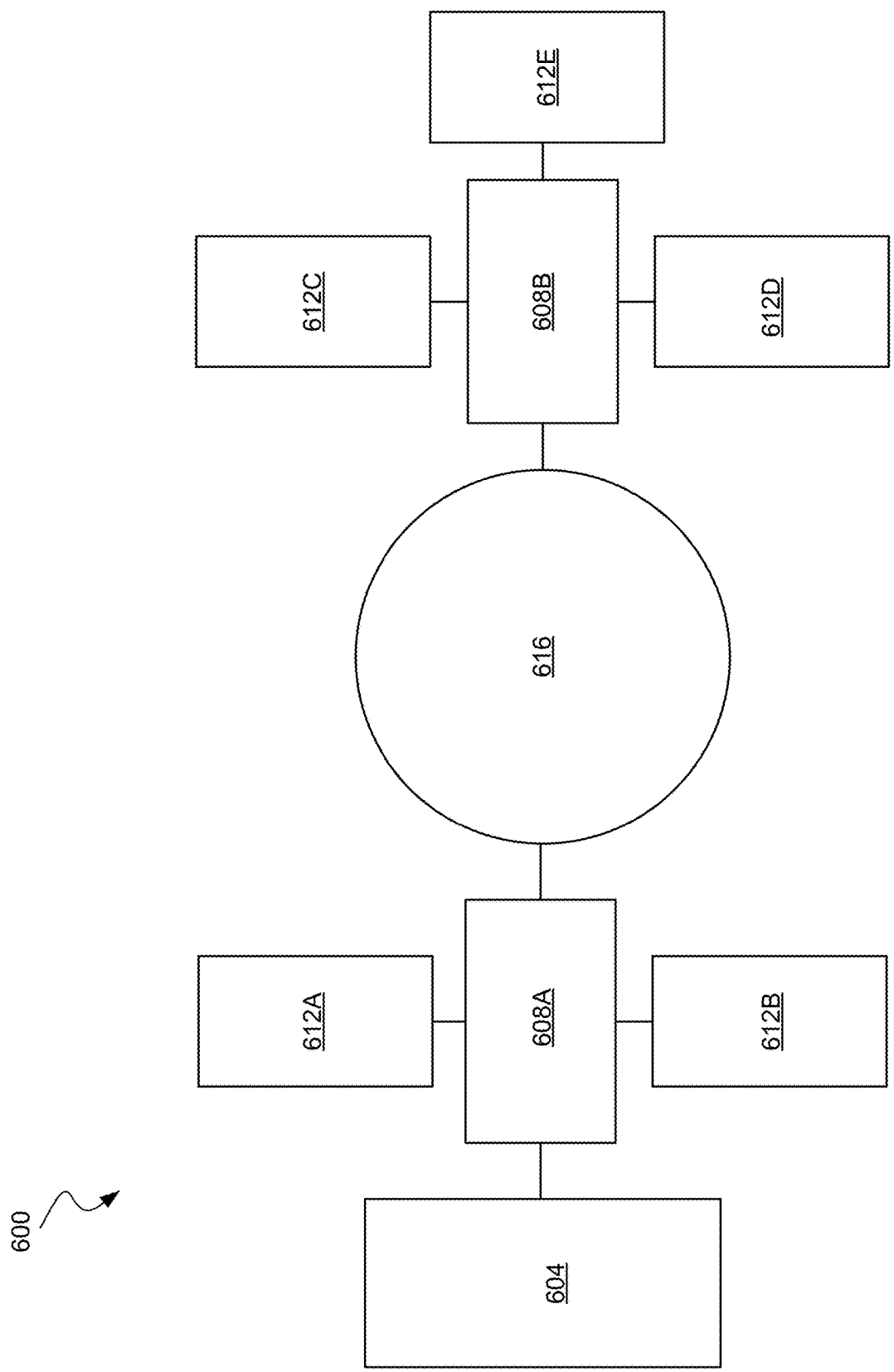
FIG. 6 shows a system for processing a substrate between different chambers at different pressures according to embodiments of the present invention.

FIG. 6 shows a system 600 for processing a substrate between different chambers at different pressures. System 600 may include a load port 604. Load port 604 may receive a carrier with substrates. A carrier may include a FOUP (front opening universal pod). A substrate may include a semiconductor wafer and any thin film layers on top of the semiconductor wafer.

System 600 may include a hub 608A. Hub 608A may be similar to a load lock that can receive and transfer wafers to other parts of system 600. For example, hub 608A may receive or transfer wafers from load port 604. Hub 608A may include a substrate holder. The substrate holder may include a plurality of end effectors for holding and transferring substrates. For example, the substrate holder may be able to hold a total of 2, 3, 4, 5 to 10, 10 to 15, 15 to 20, or 20 to 25 substrates. An end effector may be a shelf for the substrate to sit on. The substrate holder may be an end effector on a double acting transfer arm or a cassette tower elevator with multiple wafer slots.

System 600 may include a process chamber 612A. Process chamber 612A may receive a substrate or substrates from hub 608A. System 600 may include another process chamber 612B. Process chamber 612B may also receive a substrate or substrates from hub 608A. Process chambers 612A and 612B may receive substrates from hub 608A simultaneously. Accordingly, the substrate holder of hub 608A may be configured to move substrates in different directions at the same time. The substrate holder may have end effectors that can move as independent arms.

Furthermore, hub 608A may receive substrates from process chambers 612A and 612B. The substrate holder may be able to lift up a substrate in the process chambers and then transfer back into hub 608A. The transfer onto the substrate holder may be accomplished in different ways. An end effector of the substrate holder may lift the substrate off a platen in the process chamber. Alternatively or additionally, an arm within the process chamber may lift up the substrate and place the substrate onto the end effector of the substrate holder.

The substrate holder may also transfer a substrate to a process chamber and then receive another substrate from the process chamber without the substrate holder returning to hub 608A. The substrate holder may include a pair of end effectors that may both be inserted into the same process chamber. One end effector may transfer a substrate out of the process chamber, and the other end effector may transfer the substrate into the process chamber. At one point after the substrate has been transferred to the substrate holder from the process chamber but before another substrate has been transferred into the process chamber and ready for processing, the substrate holder may be holding two substrates within the same process chamber.

Alternatively, the process chamber may have a staging area for a substrate that is to be transferred out. The process chamber may then receive a substrate from the substrate holder on the location for process (e.g., a platen). The substrate holder may then pick up the other substrate from the staging area. In this manner, only one end effector needs to enter the process chamber.

System 600 may include a multi-substrate processing chamber 616. Multi-substrate processing chamber 616 may be configured to process multiple substrates simultaneously. For example, the multi-substrate processing chamber 616 may process 2, 3, 4, 5 to 10, 10 to 15, 15 to 20, or 20 to 25 substrates simultaneously. Substrates may be transferred to and from multi-substrate processing chamber 616 by the substrate holder. The substrates may be picked up individually by individual end effectors of the substrate holder to transfer substrates out of multi-substrate processing chamber 616. Alternatively, a stack of substrates may be picked up by a stack of end effectors simultaneously, where the stack may include all substrates that were processed simultaneously. Transferring substrates to the multi-substrate processing chamber 616 may involve the substrate holder placing substrates instead of picking up substrates.

Process chambers 612A and 612B may run at a lower pressure than multi-substrate processing chamber 616. Hub 608A may be configured to match the pressure of either process chambers 612A and 612B or multi-substrate processing chamber 616.

System 600 may include additional process chambers 612C, 612D, and 612E. The process chambers may or may not be identical to process chambers 612A and/or 612B. The process chambers may be for dry process (e.g., plasma processing). Multi-substrate processing chamber 616 may be a wet processing tool (e.g., wet etch, wet bench). System 600 may also include a hub 608B, which may be similar or identical to hub 608A. Hub 608B would have the ability to transfer substrates to three process chambers 612C, 612D, and 612E simultaneously.

System 600 includes 5 process chambers 612A, 612B, 612C, 612D, and 612E but is not limited to 5 process chambers. Similarly, additional multi-substrate processing chambers may be included in system 600. FIG. 6 does not show other components of system 600 for clarity. For example, gas supply, pumps, computers, and control systems are not shown.

FIGS. 7A-7F illustrate the transfer of substrates between different components of a substrate processing system 700. Substrate processing system 700 may include load port 704, hub 708, process chambers 712A and 712B, and multi-substrate processing chamber 716. System 700 may be similar to the corresponding components in system 600. System 700 may include components, similar to system 600, but such components are not included in FIGS. 7A-7F in order to focus on transfers on one side of multi-substrate processing chamber 716.

Figure 7B:
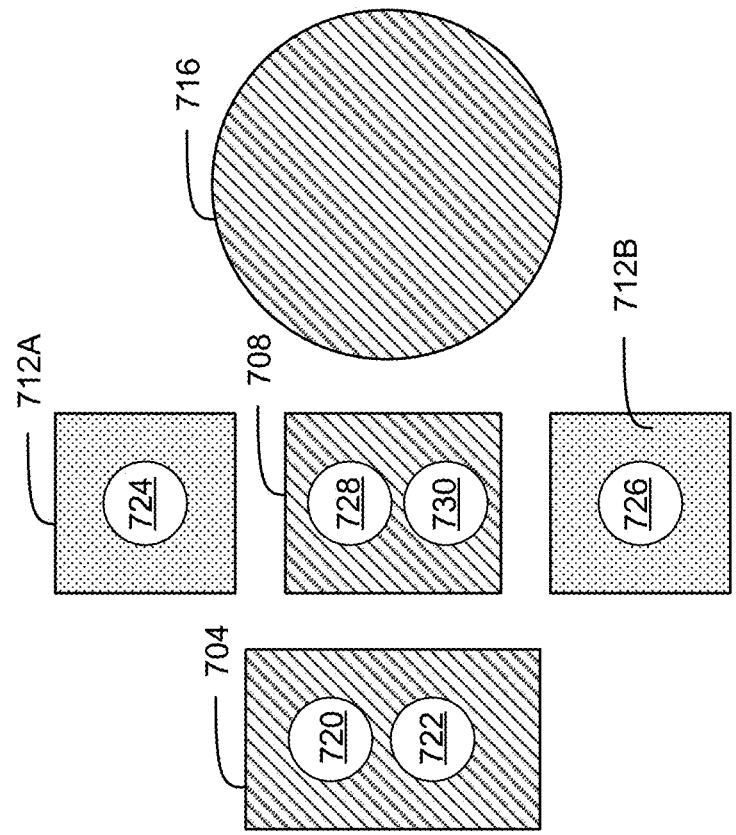
FIGS. 7A-7F illustrate the transfer of substrates between different components of a substrate processing system according to embodiments of the present invention.
Figure 7A:
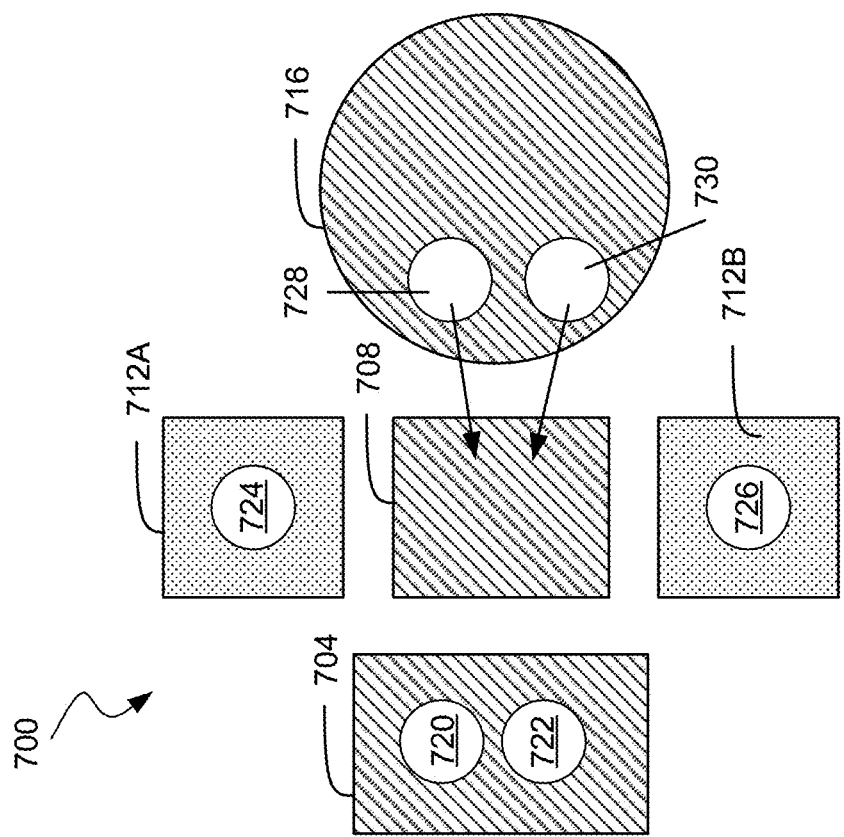

In FIG. 7A, load port 704 includes substrates 720 and 722. Process chamber 712A includes substrate 724. Process chamber 712B includes substrate 726. Multi-substrate processing chamber 716 includes substrates 728 and 730. Hub 708 does not include any substrates. In FIG. 7A, other than hub 708, the components of system 700 may include more than one or two substrates, but only one or two are shown for better clarity.

The shading of process chambers 712A and 712B, load port 704, hub 708, and multi-substrate processing chamber 716 indicates the pressure of the component. In FIG. 7A, process chambers 712A and 712B are shaded with dots, indicating one pressure. Load port 704, hub 708, and multi-substrate processing chamber 716 are shaded with diagonal lines, indicating another pressure. The pressure of load port 704, hub 708, and multi-substrate processing chamber 716 may be atmospheric pressure. The pressure of process chambers 712A and 712B may be at a lower pressure than atmospheric pressure (e.g., at vacuum).

In FIG. 7A, substrates 728 and 730 are being transferred from multi-substrate processing chamber 716 into hub 708. Both multi-substrate processing chamber 716 and hub 708 are at the same pressure to facilitate this transfer. The transfer may involve a substrate holder as described herein.

FIG. 7B shows system 700 after substrates 728 and 730 have been transferred into hub 708. Substrates 728 and 730 may be designated to undergo additional processing in process chambers 712A and 712B, which are at a different pressure than multi-substrate processing chamber 716. Accordingly, hub 708 may be isolated from multi-substrate processing chamber 716 (e.g., by closing a door or gate valve). Hub 708 may be pumped down to a pressure to match the pressure of process chambers 712A and 712B.

Figure 7D:
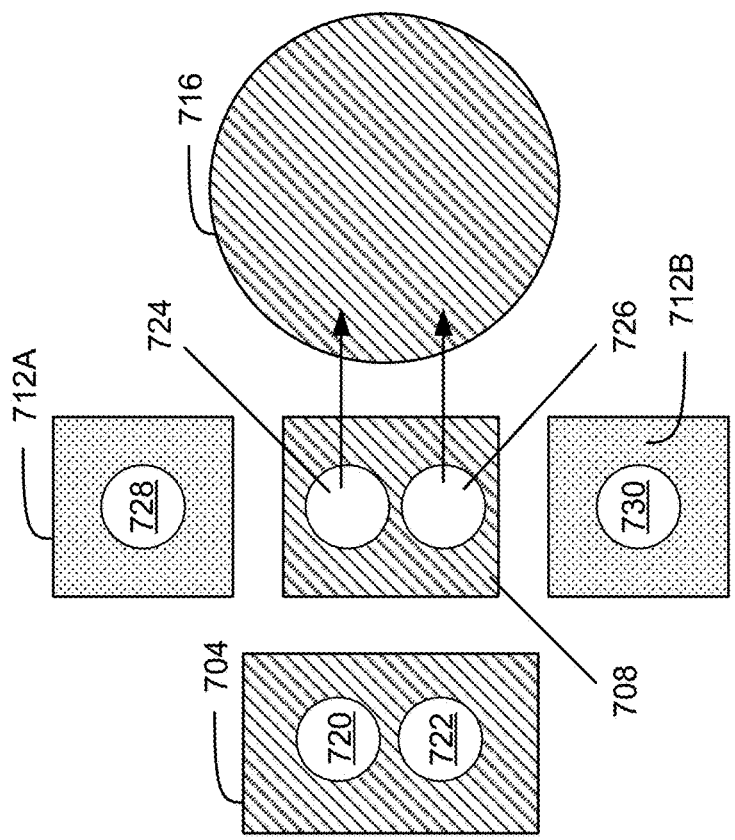
Figure 7C:
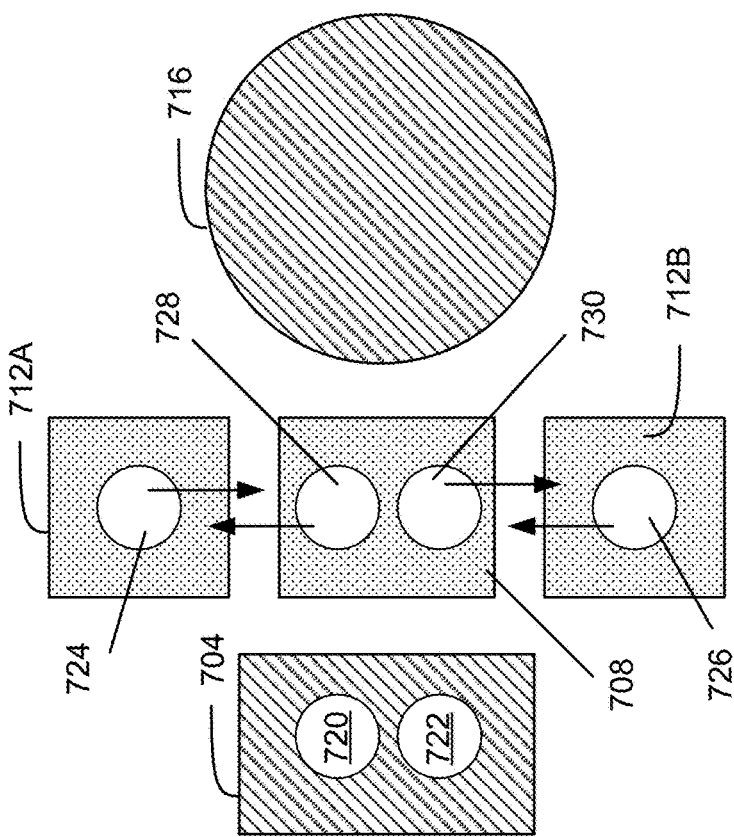

FIG. 7C shows system 700 after hub 708 has been pumped down to a pressure to match the pressure of process chambers 712A and 712B. Substrate 728 is to be transferred into process chamber 712A. Substrate 730 is to be transferred into process chamber 712B. Substrates 724 and 726 are to be transferred into hub 708. The transfer of substrates to and from hub 708 may be performed as described herein.

FIG. 7D shows system 700 after substrates 724 and 726 have been transferred into hub 708. Substrate 728 has also been transferred into process chamber 712A, and substrate 730 has been transferred into process chamber 712B. Process chambers 712A and 712B can begin processing the substrates. Substrates 724 and 726 are designated for further processing in multi-substrate processing chamber 716, which is at a higher pressure than process chambers 712A and 712B. Accordingly, hub 708 has been brought up to the higher pressure of multi-substrate processing chamber 716.

Figure 7F:
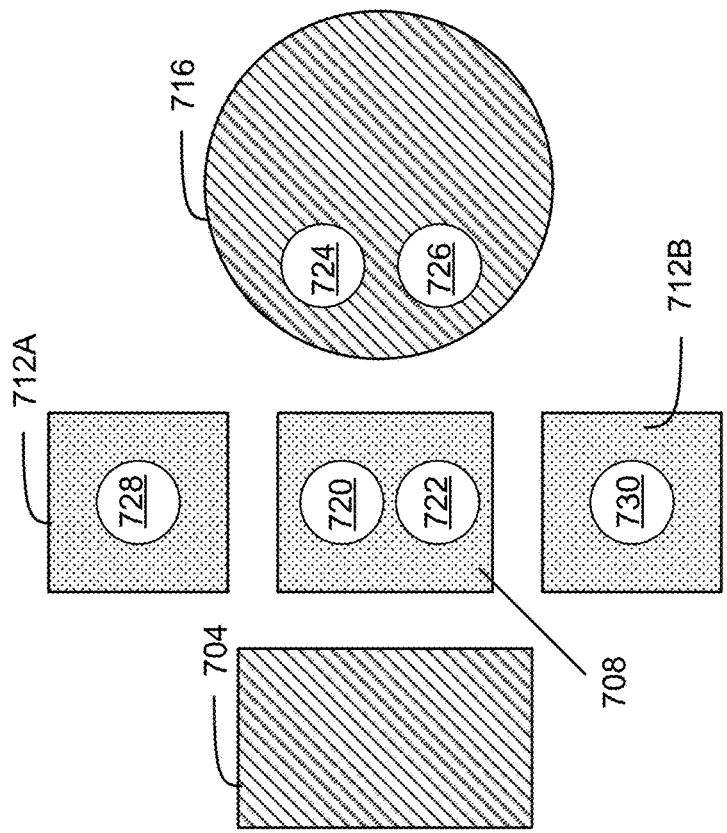
Figure 7E:
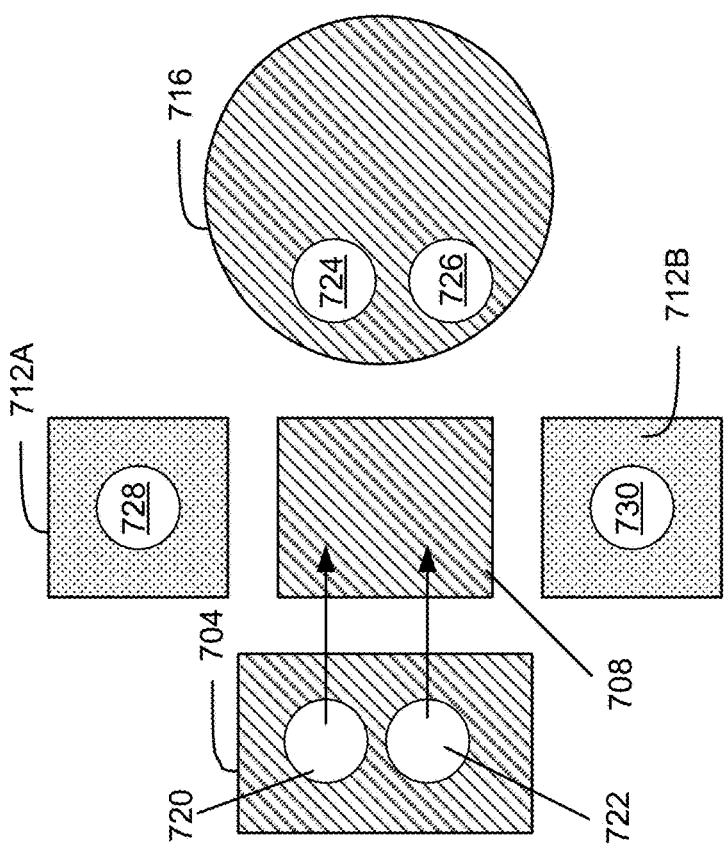

FIG. 7E shows system 700 after substrates 724 and 726 have been transferred to multi-substrate processing chamber 716. Substrates 720 and 722 on load port 704 are designated for processing in process chambers 712A and 712B. Hub 708 is already at the same pressure as load port 704. Accordingly, substrates 720 and 722 can be transferred to hub 708 without adjusting the pressure of hub 708.

FIG. 7F shows system 700 after substrates 720 and 722 have been transferred into hub 708. Because substrates 720 and 722 are to be processed in process chambers 712A and 712B, which are at a lower pressure than load port 704, hub 708 is pumped down to a lower pressure. FIG. 7F shows hub 708 at a pressure matching process chambers 712A and 712B. Substrates can then be transferred to and from process chambers 712A and 712B similar to what was explained with FIG. 7C.

Substrates can be transferred from hub 708 to load port 704 by matching the pressure of hub 708 to load port 704. The substrates may be placed into a FOUP on load port 704. The FOUP may then be transported to other equipment for further processing.

FIGS. 7A-7F show wafers being transferred to process chambers 712A and 712B after processing in multi-substrate processing chamber 716. In other embodiments, wafers may be processed in the opposite order.

B. Example Methods

Figure 8:
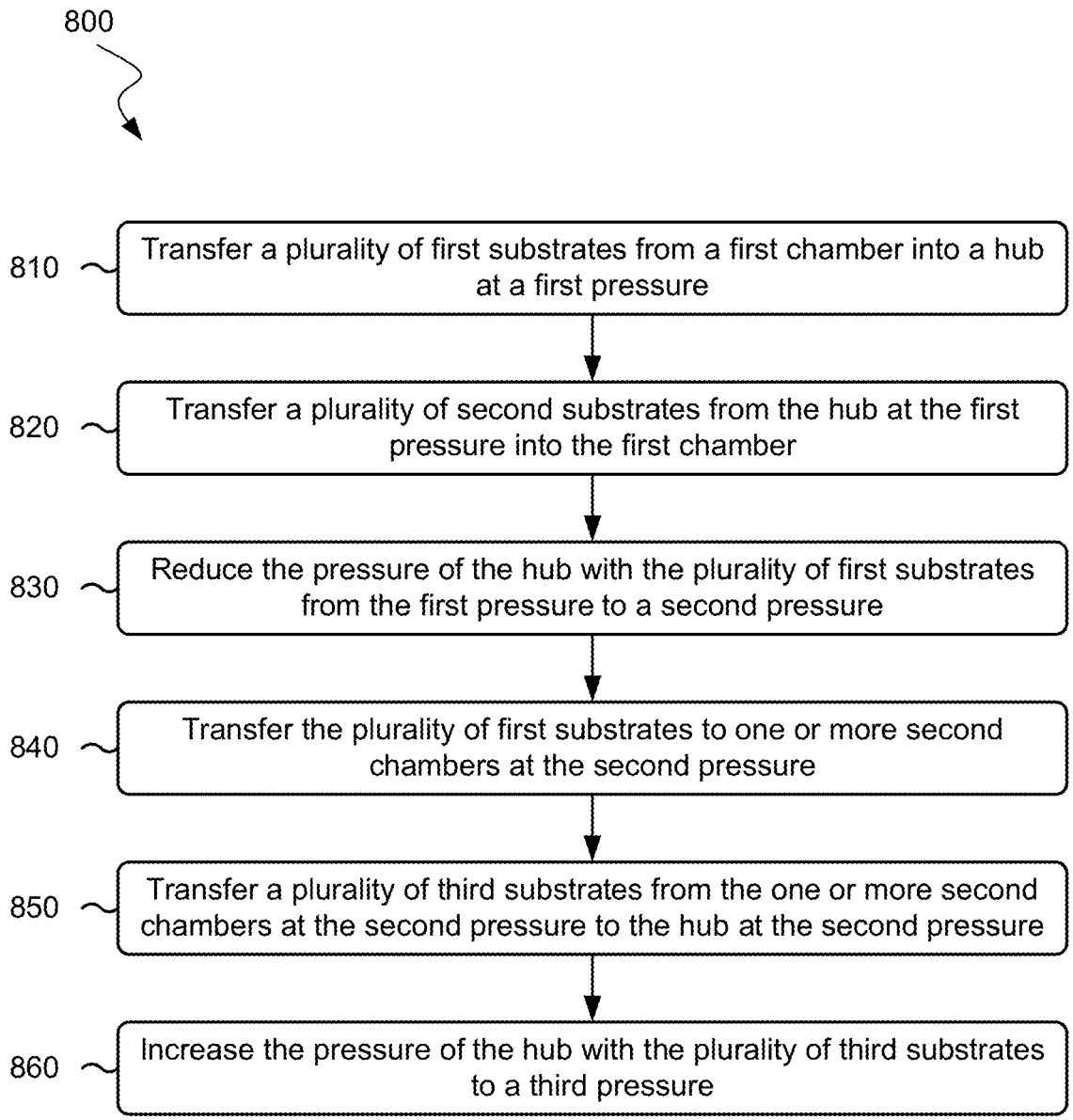
FIG. 8 is a flowchart of a process for processing a substrate according to embodiments of the present invention.

FIG. 8 is a flowchart of an example process 800 for processing a substrate. In some implementations, one or more process blocks of FIG. 8 may be performed by a substrate processing system (e.g., substrate processing system 600 or 700). In some implementations, one or more process blocks of FIG. 8 may be performed by another device or a group of devices separate from or including the substrate processing system. Additionally, or alternatively, one or more process blocks of FIG. 8 may be performed by one or more components of system 600, such as load port 604, hub 608A or 608B, process chambers 612A-612E, multi-substrate processing chamber 616, and/or a substrate holder.

At block 810, process 800 may include transferring a plurality of first substrates from a first chamber into a hub at a first pressure. For example, a substrate holder may transfer a plurality of first substrates from a first chamber into a hub at a first pressure, as described above. The first chamber may be a wet processing chamber (e.g., wet etch chamber), including multi-substrate processing chamber 616. The substrate may be any substrate described herein. As an example, the transfer may be similar to the transfer described in FIG. 7A. The first pressure may be atmospheric pressure or within 10% above or below atmospheric pressure. In some embodiments, the first pressure may be in a range from 500 Torr to 1,000 Torr.

At block 820, process 800 may include transferring a plurality of second substrates from the hub at the first pressure into the first chamber. For example, the substrate holder may transfer a plurality of second substrates from hub 608 at the first pressure into the first chamber, as described above. As an example, the transfer may be similar to the transfer described with FIG. 7D.

At block 830, process 800 may include reducing the pressure of the hub with the plurality of first substrates from the first pressure to a second pressure. For example, the substrate processing system may reduce the pressure of the hub with the plurality of first substrates from the first pressure to a second pressure, as described above. The second pressure may be 1 to 1000 milliTorr, 1 to 10 Torr, 10 to 50 Torr, 50 to 100 Torr, or 100 Torr to 200 Torr.

At block 840, process 800 may include transferring the plurality of first substrates to one or more second chambers at the second pressure. For example, the substrate holder may transfer the plurality of first substrates to one or more second chambers at the second pressure, as described above. The one or more second chambers may be dry processing chambers (e.g., process chamber 612A-612E). For example, the one or more second chambers are plasma chambers. In embodiments, transferring the plurality of first substrates to the one or more second chambers may include transferring each first substrate of the plurality of first substrates into a different second chamber of the one or more second chambers. Each second chamber may be a single-wafer processing chamber. The transfer of the plurality of first substrates into the one or more second chambers may be similar to the transfer of substrates 728 and 730 as described with FIG. 7C. In some embodiments, each second chamber may be able to process more than one wafer simultaneously; in which case, multiple first substrates may be transferred into each second chamber. The one or more second chambers may be a plurality of second chambers.

At block 850, process 800 may include transferring a plurality of third substrates from the one or more second chambers at the second pressure to the hub at the second pressure. For example, the substrate holder may transfer a plurality of third substrates from the one or more second chambers at the second pressure to the hub at the second pressure, as described above. The transfer of the plurality of third substrates may be similar to the transfer of substrates 724 and 726 described with FIG. 7C.

At block 860, process 800 may include increasing the pressure of the hub with the plurality of third substrates to a third pressure. The third pressure may be atmospheric pressure, within 10% above or below atmospheric pressure, or 500 Torr to 1,000 Torr Process 800 may include increasing the pressure of the hub may include flowing an inert gas mixture into the hub. The inert gas may include molecular nitrogen and/or a noble gas (e.g., argon). In some embodiments, increasing the pressure of the hub may include flowing atmospheric air (e.g., a mixture including nitrogen and oxygen) into the hub.

The third pressure may be equal to the first pressure (e.g., atmospheric pressure). Process 800 may further include transferring the plurality of second substrates from the first chamber into the hub at the first pressure, and transferring the plurality of third substrates from the hub at the first pressure into the first chamber. After processing of the plurality of third substrates, the plurality of third substrates may then be transferred from the first chamber to the hub at the first pressure. The plurality of third substrates may be transferred out of the hub to a carrier, which may also be at the first pressure. The carrier may be a FOUP.

In some embodiments, before the plurality of third substrates is transferred from the hub to the carrier, the hub pressure may be changed to a fourth pressure to match the pressure of the carrier. The fourth pressure may be atmospheric pressure. Process 800 may include processing of the substrates in the first chamber or the one or more second chambers.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

Figure 9:
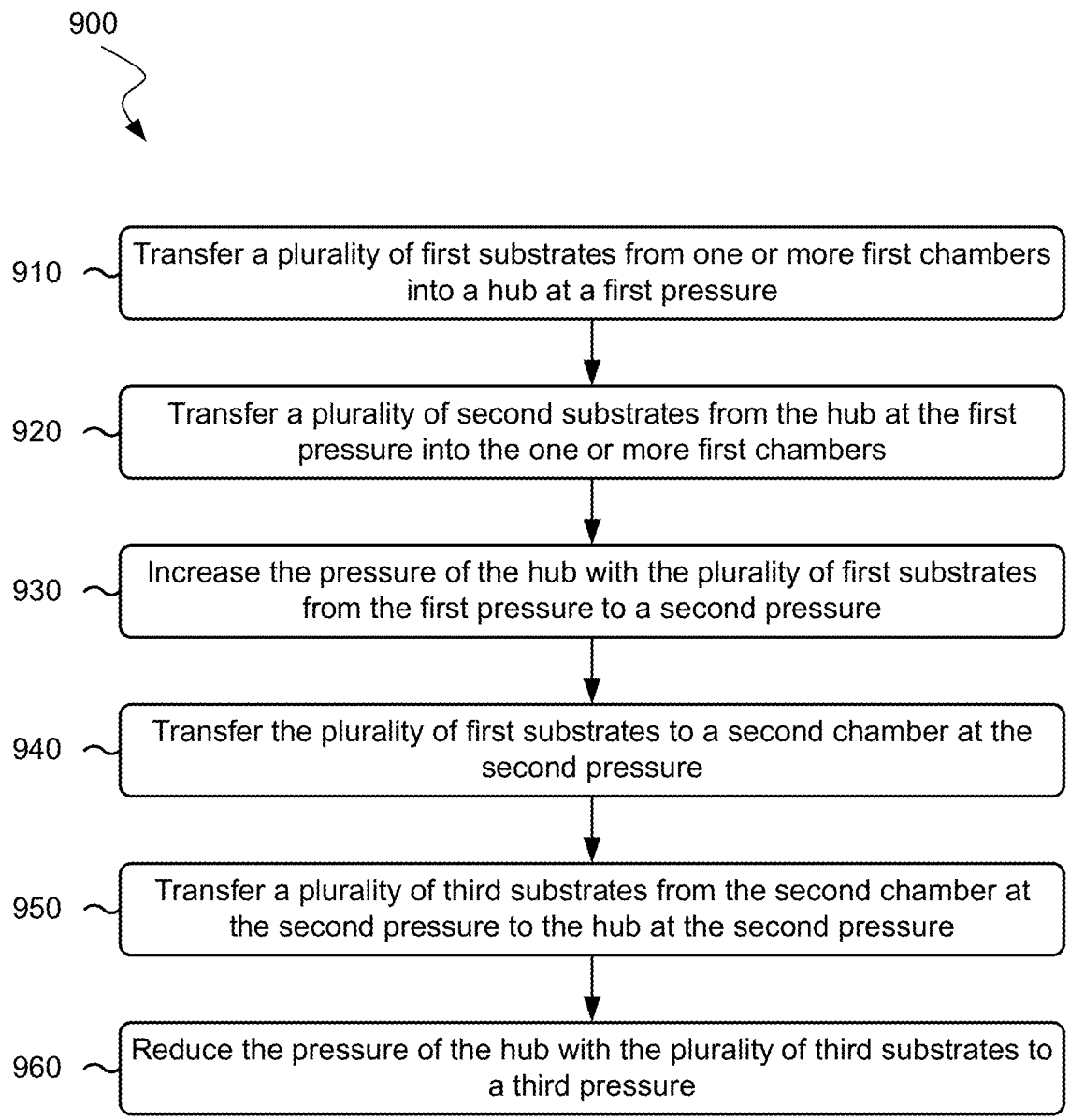
FIG. 9 is a flowchart of a process for processing a substrate according to embodiments of the present invention.

FIG. 9 is a flowchart of an example process 900 for processing a substrate. Process 900 may be similar to process 800 except that dry, low pressure processing may proceed before wet, high pressure processing. In some implementations, one or more process blocks of FIG. 9 may be performed by a system (e.g., substrate processing system 600 or 700). In some implementations, one or more process blocks of FIG. 9 may be performed by another device or a group of devices separate from or including the substrate processing system. Additionally, or alternatively, one or more process blocks of FIG. 9 may be performed by one or more components of system 600, such as load port 604, hub 608A or 608B, process chambers 612A-612E, multi-substrate processing chamber 616, and/or a substrate holder.

At block 910, process 900 may include transferring a plurality of first substrates from one or more first chambers into a hub at a first pressure. Block 910 may be similar to block 850. In some embodiments, the one or more first chambers are plasma chambers. Transferring the plurality of first substrates from the one or more first chambers may include transferring each first substrate of the plurality of first substrates from a different first chamber of the one or more first chambers.

At block 920, process 900 may include transferring a plurality of second substrates from the hub at the first pressure into the one or more first chambers. The transfer may be similar to transfers with block 840.

At block 930, process 900 may include increasing the pressure of the hub with the plurality of first substrates from the first pressure to a second pressure. Increasing pressure may be similar to block 860. Increasing the pressure of the hub may include flowing an inert gas mixture into the hub.

At block 940, process 900 may include transferring the plurality of first substrates to a second chamber at the second pressure. The transfer may be similar to block 810. The second chamber may be a wet processing chamber. The second pressure may be atmospheric pressure or within 10% above or below atmospheric pressure. In some embodiments, the second pressure may be in a range from 500 Torr to 1,000 Torr.

At block 950, process 900 may include transferring a plurality of third substrates from the second chamber at the second pressure to the hub at the second pressure. Block 950 may be similar to block 810.

At block 960, process 900 may include reducing the pressure of the hub with the plurality of third substrates to a third pressure. Reducing the pressure may be similar to block 830.

In some embodiments, the third pressure may be equal to the first pressure. Process 900 may further include transferring the plurality of second substrates from the one or more first chambers into the hub at the first pressure. Process 900 may also include increasing the pressure of the hub with the plurality of second substrates from the first pressure to the second pressure. In some embodiments, process 900 may include transferring the plurality of second substrates out of the hub to a carrier.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

C. Example Systems

Embodiments may include a substrate processing system. The substrate processing may include a wet processing chamber (e.g., wet etch chamber). The wet processing chamber may be any multi-wafer processing system described herein. The wet processing chamber may include liquids, such as acids and bases. The wet processing chamber may include a Marangoni dryer. Marangoni drying involves using isopropyl alcohol or similar organic solvent with a measurable vapor pressure to achieve a surface tension on the substrate leaving a wet bath to result in a dry substrate.

The substrate processing system may further include a single or plurality of plasma chambers. The one or more plasma chambers may include any of process chambers 612A-612E, 712A, or 712B. The plasma chamber may be inductively coupled plasma chambers or capacitively coupled plasma chambers. The plasma chamber may include a power supply to ignite a plasma and a power supply to bias a substrate during processing. The one or more plasma chambers may be a plurality of plasma chambers, including 2 to 5, 5 to 10, 10 to 15, 15 to 20, or 20 to 25 plasma chambers. The ratio of the number of plasma chambers to the wet processing chamber may be 1 to 2, or from 2 to 3, from 3 to 5, from 5 to 10, or more than 10.

The substrate processing system may include a hub having a substrate holder. The substrate holder may include a plurality of shelves configured to transport a plurality of substrates. The plurality of shelves may be end effectors. The plurality of shelves may include 10 to 16, 16 to 20, or 20 to 30 shelves. The substrate holder may be the substrate holder described in FIG. 6 or FIGS. 7A-7F. The substrate holder may be configured to extend and lower each shelf of a first subset of the plurality of shelves into a different plasma chamber of the one or more plasma chambers. The first subset may be a proportion based on the number of plasma chambers next to the hub. With two adjacent plasma chambers (as with hub 608A in FIG. 6), the first subset of the plurality of shelves may be half of the plurality of shelves. With three adjacent plasma chambers (as with hub 608B in FIG. 6), the first subset of the plurality of shelves may be a third of the plurality of shelves. The first subset of the plurality of shelves may be a fraction of the plurality of shelves equal to the reciprocal of the number of plasma chambers adjacent to the hub.

The substrate holder may be configured to extend and raise each shelf of a second subset of the plurality of shelves into a different plasma chamber of the one or more plasma chambers.

The substrate holder may be configured to extend the plurality of shelves into the wet processing chamber. The plurality of shelves may be configured to transfer a plurality of substrates into and out of the wet processing chamber simultaneously.

The substrate processing system may include one or more pumps. The pumps may be used to reduce the pressure of any of the components of the system, including the plasma chambers or the hub. The one or more pumps are connected to the one or more plasma chambers and the hub.

The substrate processing system may include a gas supply. The gas supply may introduce gases for processing in the plasma chambers. The gas supply may also include gases (e.g., nitrogen, argon) for increasing the pressure of the hub. The gas supply may be in fluid communication with the hub and/or the plasma chambers.

The substrate processing chamber may include a load port configured to receive a substrate carrier. The substrate carrier may be a FOUP. The substrate holder may be configured to extend the plurality of shelves into the substrate carrier.

In some embodiments, the system may include a second one or more plasma chambers and a second hub with a second substrate holder. The second hub may be hub 608B of FIG. 6, and the second one or more plasma chambers may be process chambers 612C, 612D, and 612E, with hub 608A being the first hub. The second substrate holder may include a second plurality of shelves configured to transport the plurality of substrates. The second substrate holder may be configured to extend and lower each shelf of a first subset of the second plurality of shelves into a different plasma chamber of the second one or more plasma chambers. The second substrate holder may be configured to extend and raise each shelf of a second subset of the second plurality of shelves into a different plasma chamber of the second one or more plasma chambers. The second substrate holder may be configured to extend the second plurality of shelves into the wet processing chamber.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

The above description of example embodiments of the invention has been presented for the purposes of illustration and description. It is not intended to be exhaustive or to limit the invention to the precise form described, and many modifications and variations are possible in light of the teaching above.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Additionally, details of any specific embodiment may not always be present in variations of that embodiment or may be added to other embodiments.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither, or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a method" includes a plurality of such methods and reference to "the substrate" includes reference to one or more substrates and equivalents thereof known to those skilled in the art, and so forth. The invention has now been described in detail for the purposes of clarity and understanding. However, it will be appreciated that certain changes and modifications may be practice within the scope of the appended claims.

"Substantially" may refer to a degree of less than completely or perfectly. For example, "substantially" may refer to something that is within 10%, 5%, or 1% of some target characteristic.

All publications, patents, and patent applications cited herein are hereby incorporated by reference in their entirety for all purposes. None is admitted to be prior art

What is claimed is:

1. A method for reducing roughness of a substrate, the substrate having a surface, the surface comprising a first material and a second material, the first material having a first roughness at the surface, the second material being different from the first material, the method comprising:
   reacting the first material with a reactant to form a first reactive layer on the substrate;
   reacting the second material with the reactant to form a second reactive layer on the substrate; and
   removing the first reactive layer to form a processed first material, the processed first material having a second roughness less than the first roughness, wherein removing comprises selectively removing the first reactive layer over the second reactive layer.

2. The method of claim 1, wherein the surface is planar within 2 nm.

3. The method of claim 1, wherein the reactant comprises an oxidizer, nitrogen, or a noble gas.

4. The method of claim 1, wherein removing the first reactive layer selectively etches the first reactive layer but not the first material.

5. The method of claim 1, wherein the second roughness is an RMS roughness less than 1 nm.

6. The method of claim 1, wherein reacting the first material with the reactant is a self-limiting reaction.

7. The method of claim 1, wherein selectively removing the first reactive layer over the second reactive layer comprises removing the first reactive layer at least twice as fast as the second reactive layer.

8. The method of claim 1, wherein the reactant is a gas or plasma.

9. The method of claim 8, further comprising:
   contacting the first reactive layer with the plasma.

10. The method of claim 8, wherein the reactant comprises a fluorocarbon.

11. The method of claim 10, wherein the fluorocarbon comprises $CF_4$, $C_2F_6$, $C_3F_8$, or a compound thereof where one or more fluorine atoms are substituted with a hydrogen atom or a non-fluorine halogen atom.

12. The method of claim 10, wherein the first reactive layer and the second reactive layer comprise carbon and fluorine.

13. The method of claim 10, wherein the reactant comprises carbon dioxide or methane.

14. The method of claim 1, wherein removing the first reactive layer comprises contacting the first reactive layer with a liquid.

15. The method of claim 14, further comprising removing the second reactive layer by dry etching the second reactive layer.

16. The method of claim 15, wherein:
   the reactant is a first reactant, and
   the second material has a third roughness at the surface, the method further comprising:
      reacting the second material with a second reactant to form a third reactive layer,
      reacting the processed first material with the second reactant to form a fourth reactive layer, and
      removing the third reactive layer to form a processed second material, the processed second material having a fourth roughness less than the third roughness.

17. The method of claim 16, further comprising removing the fourth reactive layer from the processed first material, wherein the processed first material maintains the second roughness.

18. The method of claim 1, wherein the first material is a metal.

19. The method of claim 18, wherein the second material is an oxide, a metal nitride, a metal fluoride, or a semiconductor.

20. The method of claim 18, wherein the metal comprises copper.

21. The method of claim 18, wherein the metal comprises cadmium, gold, silver, palladium, rhodium, bronze, brass, lead, nickel silver, beryllium copper, carbon steel, alloy steel, zinc, tin, nickel, cobalt, or tungsten.

* * * * *